US006651201B1

United States Patent
Adams et al.

(10) Patent No.: US 6,651,201 B1
(45) Date of Patent: Nov. 18, 2003

(54) PROGRAMMABLE MEMORY BUILT-IN SELF-TEST COMBINING MICROCODE AND FINITE STATE MACHINE SELF-TEST

(75) Inventors: R. Dean Adams, St. George, VT (US); Thomas J. Eckenrode, Endicott, NY (US); Steven L. Gregor, Endicott, NY (US); Kamran Zarrineh, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 09/626,715

(22) Filed: Jul. 26, 2000

(51) Int. Cl.[7] .............................................. G01R 31/28
(52) U.S. Cl. ...................................... 714/733; 714/734
(58) Field of Search ............................ 714/30, 724, 7, 714/733, 726, 703, 732, 741, 727, 734; 365/201; 711/106

(56) References Cited

U.S. PATENT DOCUMENTS

| | | | |
|---|---|---|---|
| 4,744,049 A | | 5/1988 | Kuban et al. |
| 4,745,574 A | | 5/1988 | Aaron et al. |
| 5,331,643 A | | 7/1994 | Smith |
| 5,396,498 A | * | 3/1995 | Lestrat et al. ............... 714/703 |
| 5,553,082 A | | 9/1996 | Connor et al. |
| 5,640,509 A | | 6/1997 | Balmer et al. |
| 5,677,913 A | | 10/1997 | Aybay |
| 5,745,498 A | | 4/1998 | Adams et al. |
| 5,751,729 A | | 5/1998 | Aybay |
| 5,771,242 A | | 6/1998 | Adams et al. |
| 5,790,564 A | | 8/1998 | Adams et al. |
| 5,796,745 A | | 8/1998 | Adams et al. |
| 5,829,015 A | | 10/1998 | Maeno |
| 5,961,653 A | * | 10/1999 | Kalter et al. ................... 714/7 |
| 6,032,279 A | * | 2/2000 | Ramamurthy et al. ...... 714/727 |

* cited by examiner

Primary Examiner—Phung M. Chung
Assistant Examiner—Mujtaba Chaudry
(74) Attorney, Agent, or Firm—Whitham, Curtis, Christofferson, P.C.; Joseph P. Abate

(57) ABSTRACT

A finite state machine (FSM) is used to generate, in real time, potentially long sequences of signals which control generation of signals for application to a memory structure during a self-test procedure which is provided in hardware on the same chip with the memory structure. The FSM-based instruction generator requires much less area than is required for storage of a corresponding number of microcode instructions and allows the built-in self-test (BIST) controller to have a modular architecture permitting re-use of hardware designs for the BIST arrangement with consequent reduction of elimination of design costs of the BIST arrangement to accommodate new memory designs. The sequential nature of the operation of a finite state machine as it progresses through a desired sequence of states is particularly well-suited to controlling capture of signals where access to high. speed data transfer circuits cannot otherwise be accommodated.

20 Claims, 7 Drawing Sheets

PROGRAMMABLE MEMORY BUILT-IN SELF-TEST COMBINING MICROCODE AND FINITE STATE MACHINE SELF-TEST

BACKGROUND OF THE INVENTION

1. Field of the Invention

The present invention generally relates to the testing of memory structures and, more particularly, to testing of memory structures included in very large scale integrated circuits (VLSI).

2. Description of the Prior Art

Increases in integration density of integrated circuits has greatly increased the performance and functionality of the circuits which can be included on a single semiconductor chip. Increased functionality, of course requires increased circuit complexity and, at the present state of the art, many functionally differentiated regions such as adders, processors, logic arrays, buffers, decoders level converters and the like may be included on a single chip. These functionally differentiated regions are often designed to operate at different clock rates and even different voltages while being required to communicate with each other in a generally synchronized fashion.

Design of storage devices and processes for their fabrication have become quite sophisticated and have resulted in very low process cost for fabrication and very small memory cell area. Therefore it is currently practical to form even relatively large numbers of storage cells together with digital signal processing circuitry on a single chip and, moreover, use of multi-port memories for communication between functional components on a chip has proven to be extremely fast and efficient and thus has come into relatively widespread use. Such memories are generally referred to as embedded memories when included with circuits having other than a storage function on an integrated circuit chip.

Nevertheless, memory cells, particularly of the dynamic type which store data capacitively, are relatively delicate devices and may be subject to damage of deterioration after being placed in service. When such devices are used for communication and data transfer among functional regions or components, the reliability of storage becomes extremely critical to the proper operation of the entire chip. Therefore, it is desirable to test storage cells periodically or at certain operating states such as power-up of the chip in order to ascertain operability.

However, access to embedded memories for testing is often difficult, particularly where chip space and external connections are at a premium. For that reason, it is preferred to form a self-test circuit on the chip, itself. Numerous types of such arrangements are known and generally referred to as a built-in self-test (BIST) circuit or engine. Some forms of BIST circuits have been developed which allow the test sequence to be dynamically modified based on a selected test methodology. The amount of chip space which can be efficiently allocated to a BIST is very limited, generally to about 2% of the area of the storage devices to be tested. This area includes all components necessary to self-test a memory structure.

Designs of embedded memories have also been developed in several classes and forms which facilitate communication and other functions. If the data, address or control signals input to an embedded memory are derived from another embedded memory, the embedded memory is said to be dependent. Otherwise, the embedded memory is said to be independent. Where a dependent memory is present, the embedded memory supplying the data, address and/or control signal is referred to as the source while the dependent embedded memory receiving the data, address, or control signal is referred to as the sink.

Also, a memory component such as data, address or control signal of a dependent memory can be fed back to the input of the same dependent memory through logic having a function that can be arbitrarily chosen, depending on the desired operation of the memory. This type of self-dependent memory structure is referred to as a complex dependent memory structure. Where such feedback is not present the memory is referred to as a simple dependent memory structure. Two exemplary simple dependent RAM structures where one RAM provides address or data to another RAM and a complex dependent memory structure are shown in FIGS. 1A, 1B and 1C, respectively. These Figures demonstrate a high-level description of dependent memory structures and are not admitted to be prior art as to the present invention.

Because of the feedback of a memory component in complex dependent memory structures, testing is complicated and generally results in high test logic overhead, particularly for the large number of combinations of operations with which such a memory must be exercised. For example, to test multi-port memories, possible interactions such as shorts between the bit lines and address decoder of adjacent ports must be tested in addition to the traditional tests for single port memories, Moreover, it is characteristic of complex dependent memory structures to be adjacent to high speed data buses. These high speed buses must also be tested for possible shorts between them. Accessing these buses is only possible through the embedded memory structure and requires test patterns with sequential behavior since they are a part of the feedback loop in the complex dependent memory structure.

Since the BIST structure must accommodate the particular application and configuration of the memory and must be integrated in the design of the chip, programmable BIST architectures have been developed to provide different test algorithms without a requirement for modification of the basic BIST unit hardware. For example, a programmable BIST module could include a programmable BIST controller and other components to control the generation of test data, address and control signals. An exemplary microcode-based programmable BIST architecture 10 is illustrated in FIG. 2 (which is a high-level demonstration and not admitted to be prior art as to the present invention).

The memory BIST controller 20 includes a microcode-based controller and instruction decode logic in order to reduce the amount of storage required to provide the desired test signals in accordance with a memory test algorithm which is described in terms of a set of supported instructions stored in an instruction storage module 40 within controller 20. The size of the instruction store module 40 thus depends on the number of required instructions and constitute the largest contribution to area overhead of the BIST unit.

The process flow within programmable BIST controller 20 and its components is illustrated in FIG. 3 (which is also not admitted to be prior art as to the present invention). Once the test algorithm is designed and compiled as indicated at 30, 31, the programmable BIST controller is initialized with a set of instructions representing the selected test algorithm, 32, for example, through an external tester. An initial instruction is dispatched (33) to the instruction decode logic 35 unless it is the last instruction, as determined at 34 to exit the testing process. The instruction is decoded into one or more test signal patterns which are applied to the memory in sequence while the responses are collected and possibly evaluated. Then the next instruction is fetched or dispatched and the process is repeated until all instructions for generation of test patterns have been executed.

Testing of complex embedded multi-port memory structures requires an especially complex test algorithm which, in turn, requires a large number of instructions and a large microcode-based controller which, in general, cannot be provided within the 2% area overhead constraint alluded to above. Therefore, programmable BIST architectures are not efficiently applied to complex multi-port memory structures. The only alternative to the area overhead would be to reduce thoroughness of the test procedure which is not feasible due to the high reliability of the memory structure which must be assured.

Further, it should be appreciated that the design effort and cost of developing and compiling large instruction sets for programmable BIST architectures capable of testing multi-port complex memory structures and the design of BIST circuits incorporating them on a chip greatly increases chip design costs. This additional cost can be particularly appreciated since it is an underlying goal of programmable BIST circuits to permit accommodation of different circuits to be tested without redesign of the BIST controller and peripheral devices 30 such as are illustrated in FIG. 2 and which may be regarded as respective portions of the instruction decode logic for respective signals applied to the memory under test. This advantage of avoiding a need for custom hardware design is, of course, lost if the hardware design must be extensively modified to accommodate additional large numbers of instructions. Further, the provision of instructions in programmable ROM is, itself, somewhat self-defeating since the testing of such programmable ROM is also difficult if the storage space is relatively large.

SUMMARY OF THE INVENTION

It is therefore an object of the present invention to provide a programmable BIST arrangement for testing of complex multi-port embedded memory structures which is area efficient.

It is another object of the invention to provide large numbers of test instructions suitable for complex multi-port memory structures without requiring hardware modification or redesign of microcode based programmable BIST circuits.

It is a further object of the invention to provide a generalized design for a BIST circuit which can accommodate complex multi-port memory structures while minimizing design cost.

It is yet another object of the invention to provide a BIST circuit of reduced chip area for a given complexity of self-test procedure.

In order to accomplish these and other objects of the invention, a built-in self-test (BIST) arrangement for an integrated circuit and an integrated circuit including such a BIST arrangement are provided wherein the BIST arrangement includes an instruction decoder for generating test signals responsive to instructions applied thereto, a microcode instruction store for providing instructions to the instruction decoder, and a finite state machine for generating a plurality of instructions and providing them to the instruction decoder responsive to a test specific instruction being output by said microcode instruction store.

In accordance with another aspect of the invention, a method of testing a memory is provided including steps of dispatching an instruction from an instruction store, activating an instruction generator in response to a test specific instruction being dispatched from the instruction store, generating and delivering a plurality of instructions to an instruction decoder from the instruction generator, and delivering other instructions dispatched from the instruction store to the instruction decoder.

By using a finite state machine to generate instructions in parallel with delivery of stored instructions from an instruction store chip space can be much more efficiently utilized for a BIST arrangement. Further, the sequential nature of a finite state machine as it transitions from a state-to-state facilitates the generation of instructions which assist in data capture at times interspersed among test signals of a test signal sequence when test results are not otherwise accessible.

The use of finite state machines, itself, provides some economy of chip design since FSM design methodology is well-developed and chip layout can be largely automated from a relatively simple behavioral description. The architecture of the preferred form of the invention (providing the FSMs as modular instruction generators) allows re-use and economical modification of existing modules of BIST architecture modules to further reduce expense of new chip designs.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
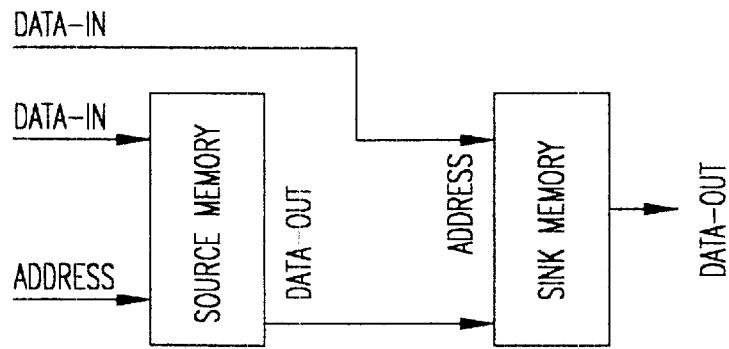
FIGS. 1A and 1B are highly schematic depictions of exemplary simple multi-port dependent memory structures.
Figure 1B:
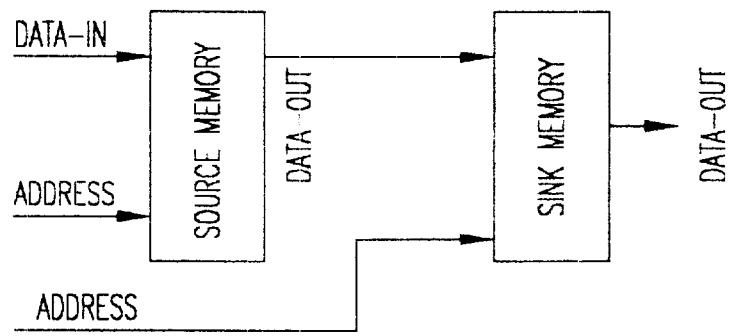
Figure 1C:
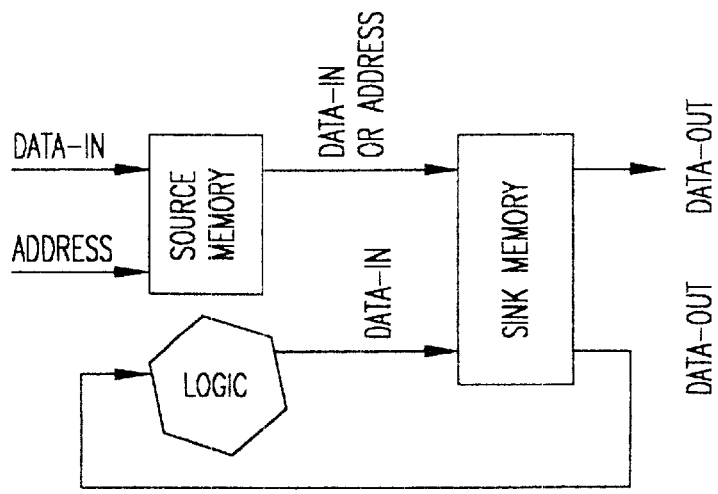
FIG. 1C is a highly simplified depiction of an exemplary complex multi-port dependent memory structure.
Figure 2:
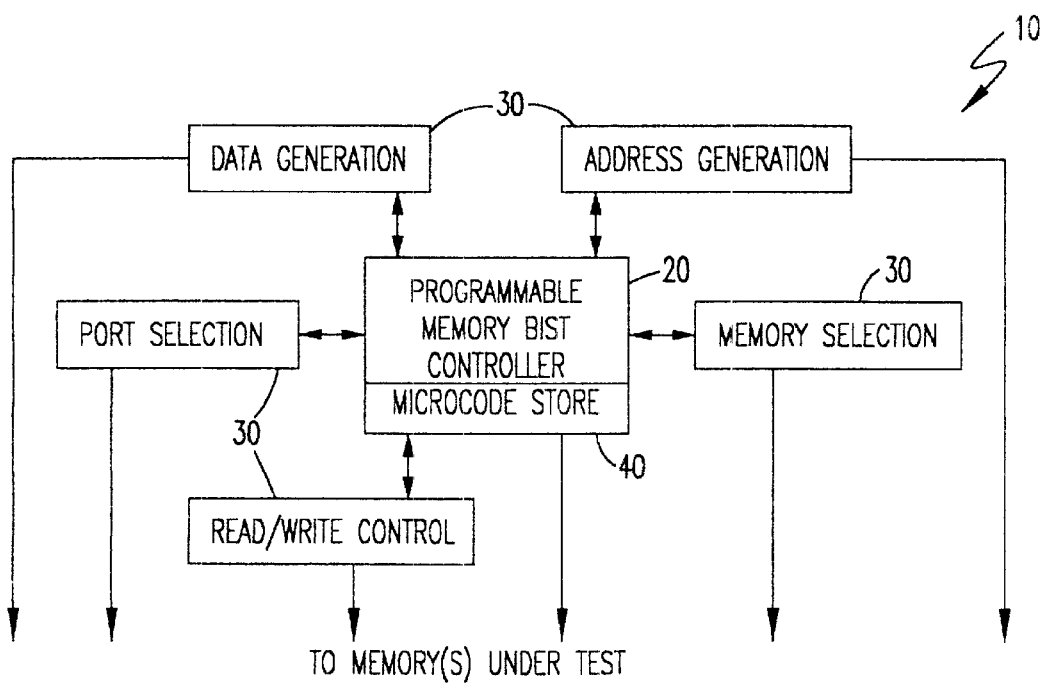
FIG. 2 is a block diagram depicting an exemplary programmable BIST architecture.
Figure 3:
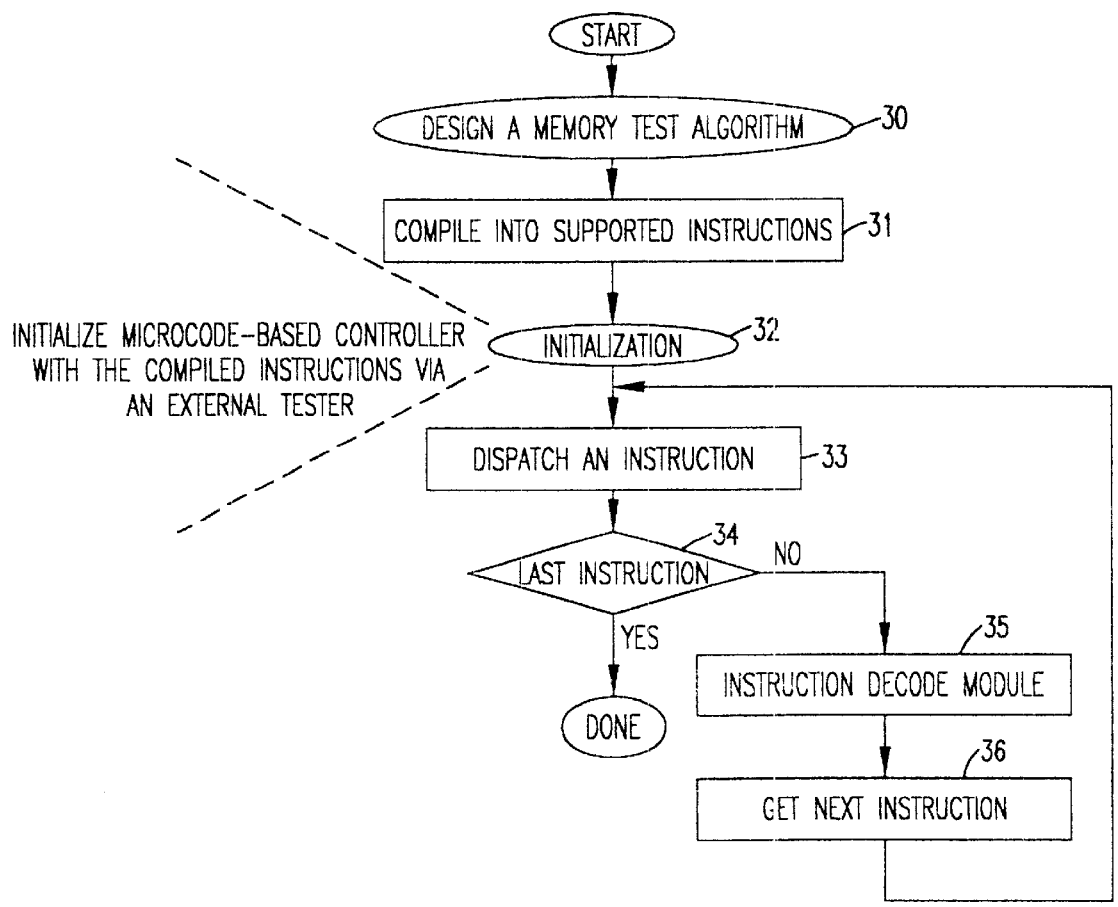
FIG. 3 is a flow chart depicting access flow in the BIST controller of FIG. 2.
Figure 4:
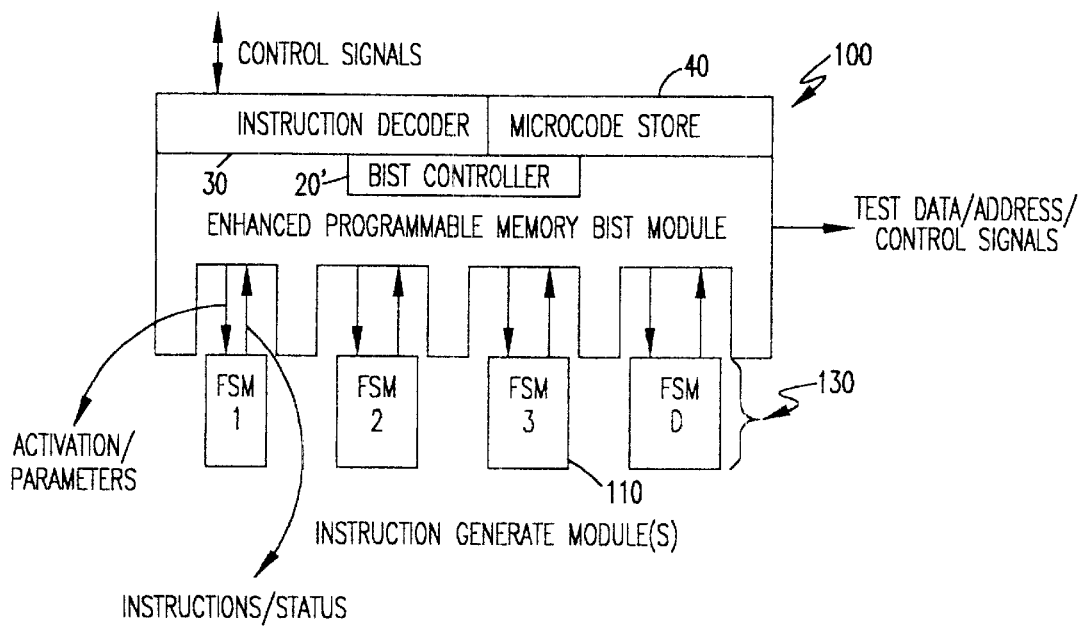
FIG. 4 is a highly conceptualized diagram of a programmable BIST architecture in accordance with the invention.

Referring now to the drawings, and more particularly to FIG. 4, there is shown a highly conceptualized diagram of the enhanced programmable memory BIST module in accordance with the invention. Some of the elements illustrated such as the instruction decoder 30 and microcode store 40 are substantially similar to the corresponding elements depicted in the programmable BIST architecture illustrated in FIG. 2 and discussed above. However, the microcode stored in microcode store 40 is altered somewhat from that used in the architecture of FIG. 2 as will be discussed below in connection with FIG. 5. The BIST controller 20 in accordance with the invention will be more fully discussed below in connection with FIG. 6.

A particularly distinctive feature of the BIST module 100 is the use of instruction generate modules 110 which comprise finite state machines (FSM). Conceptually, a finite state machine comprises a circuit which can assume any one of a finite number of states wherein changes between states are performed in response to arbitrary but specified conditions and each state may be associated with one or more actions which may be collectively referred to as a behavior. The changes between states that are permitted for each of a plurality of conditions or inputs may be defined to form a sequence of states. The sequence of states may be variable (e.g. branching may be provided), depending on the conditions presented or test results derived in the course of the testing procedure.

Figure 5:
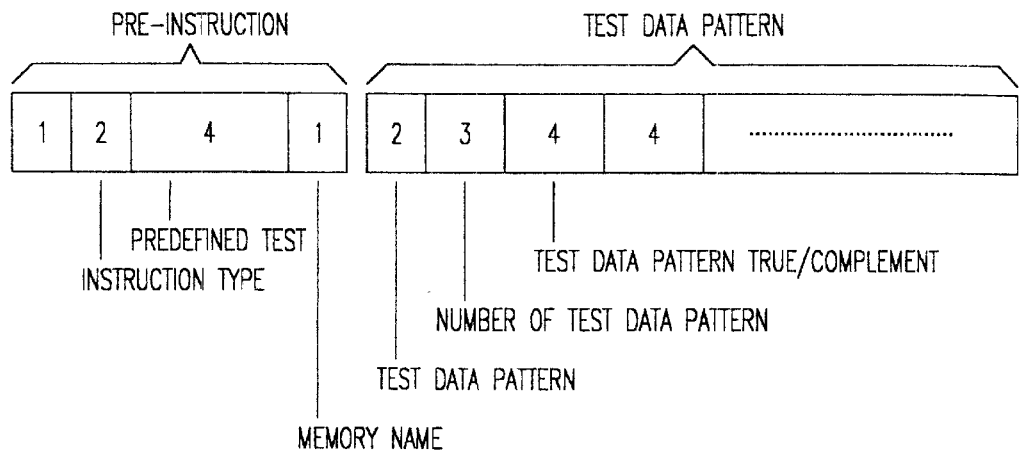
FIG. 5 is a schematic depiction of code in an exemplary test instruction.
Figure 5A:
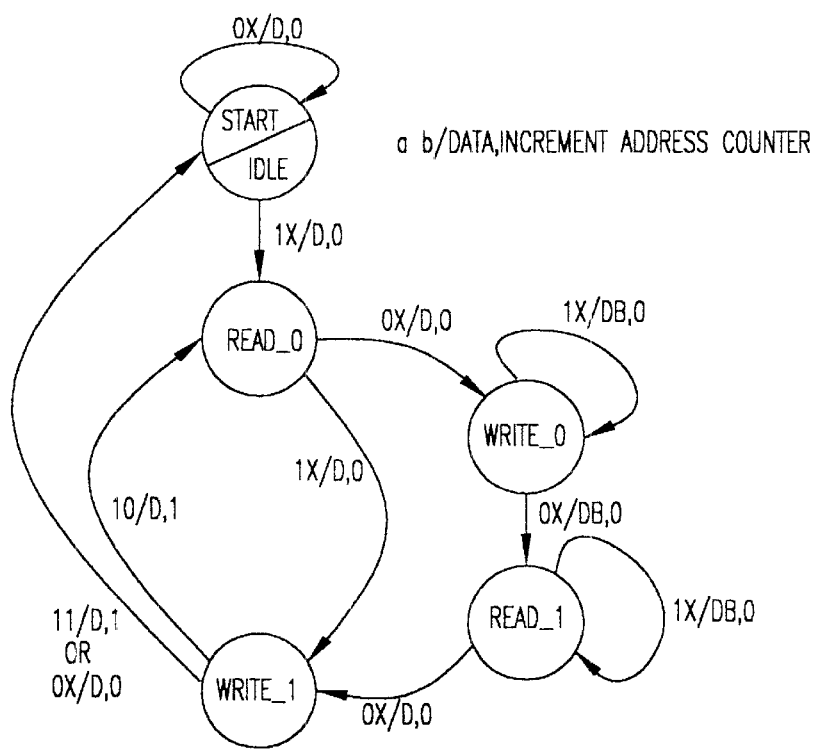
FIG. 5A is a diagram of an exemplary finite state machine usable in the preferred embodiment of the invention.

An exemplary state machine appropriate to testing is shown in FIG. 5A, in which the FSM comprises five states with two inputs and two outputs. The two input signals activate the FSM and determine the path to be taken in the FSM at transitions between states, respectively. The two output signals are data value, D, and a signal to increment the address counter, respectively. The data value (not data value), D (DB), is used to determine the polarity of the expected results to be read or polarity of data to be written to a memory cell. Transitions between states are indicated by arrows and the conditions/inputs to which the transitions are responsive and the output values (e.g. D,0) are indicated beside each arrow indicating a state transition. Generally such state machines may be implemented very simply and with an extremely compact footprint when formed as an integrated circuit or a portion thereof with, for example, transmission gates controlled by signals in a condition register.

Therefore, it can be-seen that, particularly in the context of memory testing a finite state machine can be arranged to provide an arbitrarily long sequence of states and, moreover, in combination with an instruction decoder, each state can generate a sequence of test patterns of substantial length. Further, in combination with a programmable microcode-based controller test patterns can also be generated from microcode and, as will be explained in greater detail below, any arbitrary number of FSMs may be employed in the BIST module in accordance with the invention.

Of course, the number of FSMs is, as a practical matter, limited by the constraint on BIST module chip space. However, each FSM employed will represent a substantial savings in chip area over the area required for a comparable number of microcode instructions that can be provided from storage. Further, FSMs may be designed readily by known methodology from a relatively simple description of the desired behavior and chip layout can be largely automated. The FSMs as utilized in the invention and combined with the microcode-based BIST controller in the BIST module in accordance with the invention, are substantially modular and can be virtually "plugged in" to a desired design, as illustrated in FIG. 4.

Referring now to FIG. 5 an exemplary microcode command in accordance with the invention is shown. Testing of dependent memory structures requires the programmable BIST module to support a regular instruction to read or write all memory cells and an address-specific instruction to perform a read or write operation to a specific address location. The activation of a FSM instruction generate module is performed through execution of a special instruction by the microcode-based controller and referred to as a test-specific instruction preferably comprising an 8-bit pre-instruction and a set of bits (e.g. 39-bits) create a test data pattern field.

The microcode pattern or format may assume any of many forms which will be evident to those skilled in the art in view of the various fields discussed below which should be considered as being preferred but not critical in order, size or number to the successful practice of the invention. For example, the first bit in the pre-instruction field indicates whether the instruction is valid or not. The second and third bits specify the type of instruction, such as a test specific instruction. Each of the following four bits indicates the type of memory test algorithm which results in activation of a FSM-based instruction generate module. The last bit in the pre-instruction field indicates which memory component of the dependent memory structure is being tested.

Similarly, in the test data pattern field, the first two bits indicate the test data pattern used to initialize the memory under test. The next three-bit field indicates the number of test data patterns of four bits each specified in the remainder of the field. These four bit data patterns specify the true and complement test data patterns applied to the memory under test. Any remaining bits are simply unused.

Figure 6:
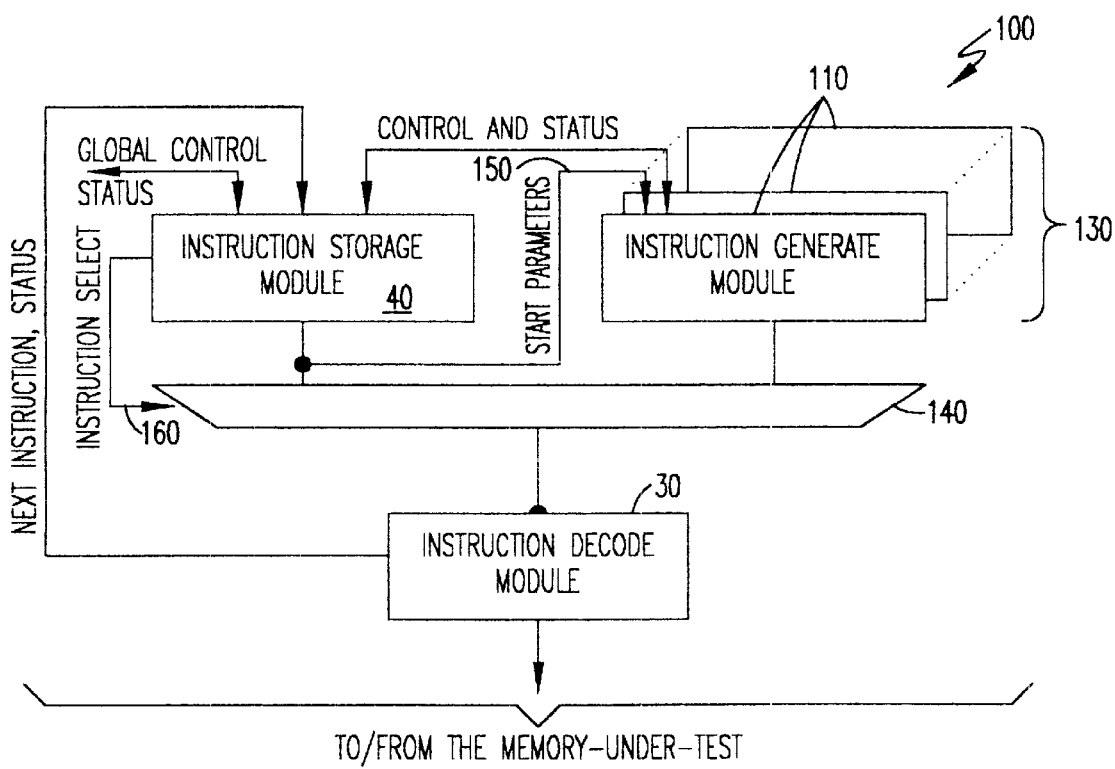
FIG. 6 is a block diagram of a BIST controller in accordance with the invention.

The group of instruction generate modules employed is referred to as the test-specific module 130 and each instruction generate module is essentially a FSM-based microcontroller 110, as will be apparent from FIG. 6. It should be understood that both FIG. 4 and FIG. 6 show a high-level depiction of functional portions of the enhanced BIST controller in accordance with the invention although the depictions are differently articulated internally; FIG. 4 being more conceptual and FIG. 6 being more functional.

In particular, the layout of FIG. 6 is intended to illustrate that instruction store module 40 and a single one of the instruction generation modules alternatively provide signals over bus 140 to the instruction decode module 30 which, in turn, provides the signals for exercising the memory under test. While control and status signals are provided to both the instruction store module and any active instruction generate module, the activation of any particular instruction generation module 110 is controlled by the microcode read from the instruction store module 40, as indicated by connection 150. That is, activate/deactivate signals for an FSM and FSM parameters are provided to the instruction generate module from the microcode based controller and "last instruction", "valid instruction", "module active" and "done" signals are sent from the instruction generate module to the microcode-based controller/instruction module.

Specifically, when the microcode instruction is to be provided directly from the instruction store module 40 to the decode module 30, it is placed directly on bus 140 over connection 160. However, when the second and third bits of the pre-instruction of a microcode instruction indicate a test specific instruction and the fourth through seventh bits indicate a particular FSM based controller/instruction generate module 110, that FSM-based controller is activated and the bus ports are controlled to accept the outputs thereof to deliver signals or sequences of signals corresponding to the sequence of respective states of the FSM to instruction decode module 30.

When the instruction decode module has completed sending the test-signals corresponding to the microcode instruction from the instruction store module or the last instruction signal from the active instruction generate module 110, a further microcode instruction is called from the instruction store module 40 which may, in fact, activate the same or another instruction generate module. If the instruction generate module specified in a microcode instruction is not present, the instruction is treated as a no-operation command, allowing microcode instruction sets created for some memory configurations to be used with simpler memory configurations or extended to more complex memory configuration by the addition of one or more instruction generate modules invoked by only a few microcode instructions.

Figure 7:
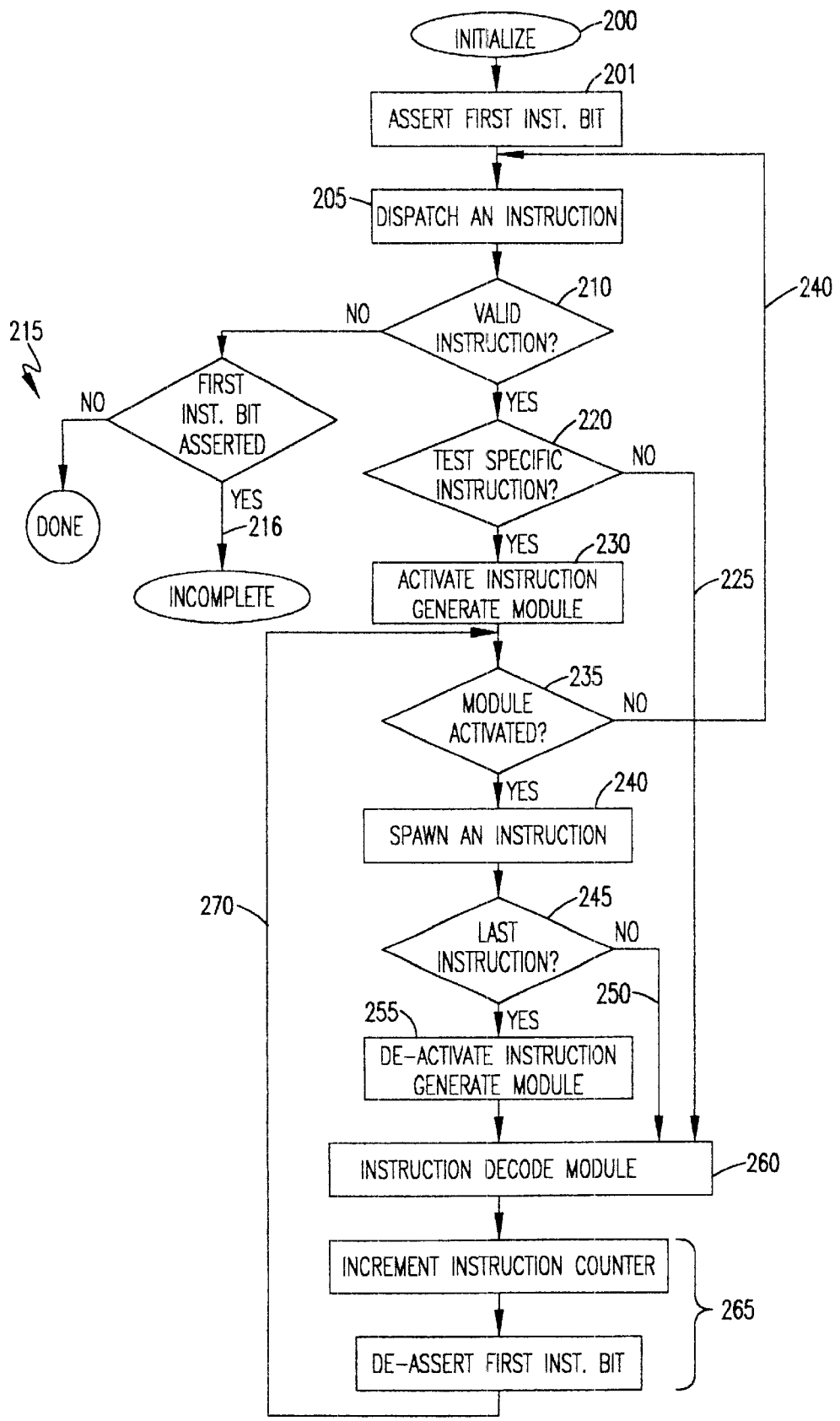
FIG. 7 is a flow chart depicting the operation of the BIST controller of FIG. 6.

Referring now to the flow chart of FIG. 7, a preferred mode of operation of the invention will now be discussed in detail. It should be appreciated that other sequences of the operations illustrated are possible and will be evident to those skilled in the art in view of the following explanation of the preferred mode of operation.

The self-test process is initiated by an externally applied test command (e.g. from an external tester) or an internally generated command such as a command in the power-up sequence for the chip, read from an associated external or internal read only memory or the like. In response to such a signal or command, the memory structure to be tested is initialized by setting the contents of respective memory cells to predetermined desired digital logic states, as indicated at 200, and a first instruction bit is asserted, as indicated at 201. Once initialization is complete, a microcode instruction is dispatched from instruction store module 40 (FIG. 6), as illustrated at 205. As alluded to above, this instruction is preferably in the format illustrated in FIG. 5 and discussed above. The instruction is tested at 210 to determine if it is a valid instruction. The first instruction bit is checked and if the first instruction bit is asserted, then the process exits at 216 (incomplete). Otherwise, the process terminates at 215.

If the instruction is a valid instruction, the "instruction type" bits of the instruction header or pre-instruction are tested to determine if the instruction is test specific at 220. If not, the instruction is forwarded to the instruction decode module 30 via connection 160 and bus 140, as depicted at 225 for generation of signals by the instruction decode module to be applied to the memory under test. However, if the instruction is test specific, an instruction generate module is activated (230) in accordance with the "predefined test" bits of the pre-instruction.

As alluded to above, the particular memory under test might be fully tested with only one or a few instruction generate modules 110 while it may be convenient and/or economical to provide microcode and other architecture in accordance with the invention that is also suitable for more extensive testing (e.g. to use code and circuit designs which have been developed for other memories to avoid the cost of further memory-specific test algorithm design). Nevertheless, exercising the memory more extensively would unnecessarily extend the time of the test procedure, particularly if no useful information concerning full functionality of the memory would be derived. Therefore, if particular sequences of test signals are to be omitted, the particular FSM-based instruction generate module may simply be omitted from the BIST structure. Thus, a test 235 to ascertain activation of an instruction generate module 110 has a dual function of determining that a specified instruction generate module, if present, has, in fact, been activated or, if the instruction generate module is not present, functionally performing a "no operation" by looping (240) to 205 to obtain the next microcode instruction.

If the specified instruction generate module has been activated, an instruction is spawned from the activated instruction generate module in accordance with the current state of the finite state machine (FSM), as shown at 240. One or more instructions may be spawned from any specific state of the FSM. Changes of state of the FSM of the instruction generate module can be controlled in any desired manner including but not limited to comparison of the test results with expected results or a given number of repetitions of an instruction or sequence of instructions; each instruction providing one or more signals for exercising the memory under test. Instructions may also be spawned which control the capture of information at accessible points in the memory structure when the result of the test is not otherwise directly accessible.

Each instruction generate module asserts the last instruction signal when there is no instruction left to generate. This signal is tested (245) and if it is not asserted, the instruction is forwarded to the instruction decode module 30 via bus 140, as illustrated at 250. If the instruction is the last instruction to be generated by the activated instruction generate module, the module is deactivated (255) prior to forwarding the instruction to the instruction decode module. The application of each generated instruction to the instruction decode module exactly parallels the application of a microcode instruction read from instruction store module 40 to the instruction decode module 30, as described above. However, it can be readily appreciated that the potentially large number of instructions available from the FSM-based instruction generate module are generated in real time while the test is being performed and no storage space need be allocated for storage of correspondingly large numbers of microcode instructions.

Thus, it is seen that the process in accordance with the invention delivers an instruction to instruction decode module 30 in any of three ways, as illustrated at 260: a stored microcode instruction or an address specific instruction may be delivered directly if it is not a test specific instruction or a test specific instruction or a regular instruction can be generated and delivered in real time by an activated FSM-based instruction generate module either with or without deactivation of the module based on whether or not the instruction is a last instruction generated by the activated instruction generate module. Upon execution of the instruction by beginning the generation of one or more signals to be applied to the memory under test by the instruction decode module 30, the next instruction is called for, as illustrated at 265, incrementing the instruction counter, de-asserting the first instruction bit, __indicating that at least one valid instruction has been successfully executed and looping (270) to 235, where it is again determined if an instruction generate module is activated.

If the instruction generate module 110 remains activated, the process described above repeats until the last instruction generated by the instruction generate module is reached and the module de-activated. If the module is deactivated upon execution of loop 270, the process loops through loop 240 to 205 whereupon another microcode instruction is obtained from instruction store module 40 which may or may not result in activation of another or the same instruction generation module 110 depending on whether or not the microcode instruction is a test specific instruction.

If the instruction fetched/dispatched at 205 is an invalid instruction, the testing process is completed (at least to the extent of specifying signals to be applied to the memory, since the decoding of the preceding instruction at 260 may not yet be complete and evaluation of the test results may or may not have begun or remain in progress) and the memory test exits to 215. In the case of an invalid instruction (210), the status of the first instruction bit is tested and if the first instruction bit is asserted, the memory test is called incomplete. However, if the first instruction bit is not asserted, the process is considered to have been completed. The process terminates in either case.

In view of the foregoing, it is seen that the invention provides a modular architecture for a BIST circuit to reduce or eliminate design costs for providing tests suitable for new memory designs. The BIST arrangement in accordance with the invention can accommodate testing of complex memories within severe limitations on chip area allocated thereto. The chip area efficiency provided by virtue of using finite state machine instruction generators in accordance with the invention allows substantial reduction in required chip area for any given complexity of testing. The sequential nature of the signals which can be provided by a finite state machine is also very well-suited to the capture of signals, particularly in portions of a complex memory or other very high speed data links where provision of other intervening logic is inconsistent with intended performance. Modular architecture of the FSM-based instruction generators provides re-use and simplified modification of existing BIST designs to further increase economy of new chip design. FSM design methodology is also well-understood and chip layout can be largely automated; providing other potential economies.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A built-in self-test (BIST) arrangement for an integrated circuit including:
    an instruction decoder for generating test signals responsive to instructions applied thereto,
    a microcode instruction store for storing and providing instructions, said instructions including test specific instructions, and instructions other than said test specific instructions being provided to said instruction decoder, and
    a finite state machine for generating a plurality of instructions and providing said plurality of instructions in parallel with said instructions other than said test specific instructions to said instruction decoder responsive to a test specific instruction being output by said microcode instruction store.

2. A BIST arrangement as recited in claim 1, wherein said integrated circuit includes an embedded memory and said instruction decoder applies test signals to said embedded memory.

3. A BIST arrangement as recited in claim 2, wherein said embedded memory is a complex dependent memory structure.

4. A BIST arrangement as recited in claim 1, wherein said finite state machine comprises an instruction generate module.

5. A BIST arrangement as recited in claim 1, wherein said finite state machine comprises one of a plurality of instruction generate modules.

6. An integrated circuit having at least one functional section and a built-in self-test (BIST) arrangement for testing said functional section, said BIST arrangement including
    an instruction decoder for generating test signals responsive to instructions applied thereto,
    a microcode instruction store for storing and providing instructions, said instructions including test specific instructions, and instructions other than said test specific instructions being provided to said instruction decoder, and
    a finite state machine for generating a plurality of instructions and providing said plurality of instructions in parallel with said instructions other than said test specific instructions to said instruction decoder responsive to a test specific instruction being output by said microcode instruction store.

7. An integrated circuit as recited in claim 6, wherein said functional section includes an embedded memory and said instruction decoder applies test signals to said embedded memory.

8. A BIST arrangement as recited in claim 7, wherein said embedded memory is a complex dependent memory structure.

9. A BIST arrangement as recited in claim 6, wherein said finite state machine comprises an instruction generate module.

10. A BIST arrangement as recited in claim 6, wherein said finite state machine comprises one of a plurality of instruction generate modules.

11. A method of testing a portion of an integrated circuit, said method including steps of
    dispatching an instruction from an instruction store,
    activating an instruction generator in response to a test specific instruction being dispatched from said instruction store,
    generating and delivering a plurality of instructions to an instruction decoder from said instruction generator, and
    delivering other instructions dispatched from said instruction store to said instruction decoder in parallel with said plurality of instructions from said instruction generator.

12. A method as recited in claim 11, wherein said step of generating and delivering a plurality of instructions is performed in accordance with respective states of a finite state machine.

13. A method as recited in claim 12, including the further step of dispatching a next instruction when said instruction generator is not activated by said activating step.

14. A method as recited in claim 11, including the further step of
    deactivating an instruction generator in response to a last instruction being output from said instruction decoder.

15. A method as recited in claim 11, including the further step of
    asserting an instruction bit indicating validity of an instruction.

16. A method as recited in claim 15, including the further step of
    de-asserting said instruction bit upon output of a last instruction from said instruction generator.

17. A method as recited in claim 16, including the further step of
    determining a test to be incomplete when said instruction bit is asserted with an invalid instruction.

18. A method as recited in claim 11, wherein said portion of an integrated circuit is an embedded memory.

19. A method as recited in claim 18 wherein said embedded memory is a complex dependent memory.

20. A method as recited in claim 11, wherein respective ones of said plurality of instructions exercise said portion of said integrated circuit and control capture of test results.

* * * * *